United States Patent
Xiong et al.

(10) Patent No.: US 12,125,675 B2
(45) Date of Patent: Oct. 22, 2024

(54) RF PULSING ASSISTED LOW-K FILM DEPOSITION WITH HIGH MECHANICAL STRENGTH

(71) Applicant: Applied Materials, Inc., Santa Clara, CA (US)

(72) Inventors: Ruitong Xiong, San Jose, CA (US); Bo Xie, San Jose, CA (US); Xiaobo Li, Sunnyvale, CA (US); Yijun Liu, Santa Clara, CA (US); Li-Qun Xia, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 467 days.

(21) Appl. No.: 17/475,721

(22) Filed: Sep. 15, 2021

(65) Prior Publication Data

US 2023/0094012 A1 Mar. 30, 2023

(51) Int. Cl.
| | | |
|---|---|---|
| H01L 21/02 | (2006.01) | |
| C23C 16/40 | (2006.01) | |
| C23C 16/505 | (2006.01) | |
| C23C 16/56 | (2006.01) | |
| H01J 37/32 | (2006.01) | |

(52) U.S. Cl.
CPC ...... *H01J 37/32146* (2013.01); *C23C 16/401* (2013.01); *C23C 16/505* (2013.01); *C23C 16/56* (2013.01); *H01J 37/32522* (2013.01); *H01J 37/32889* (2013.01); *H01L 21/02164* (2013.01); *H01L 21/02211* (2013.01); *H01L 21/02216* (2013.01); *H01L 21/02274* (2013.01); *H01L 21/02348* (2013.01); *H01J 2237/332* (2013.01)

(58) Field of Classification Search
None
See application file for complete search history.

(56) References Cited

U.S. PATENT DOCUMENTS

| | | | |
|---|---|---|---|
| 2006/0286814 A1* | 12/2006 | Kumada | H01L 21/76834 257/14 |
| 2008/0026597 A1* | 1/2008 | Munro | C23C 16/56 257/E21.24 |
| 2014/0113457 A1* | 4/2014 | Sims | H01L 21/02167 438/778 |
| 2021/0257213 A1* | 8/2021 | Kikuchi | B05D 1/62 |

\* cited by examiner

*Primary Examiner* — Asok K Sarkar
(74) *Attorney, Agent, or Firm* — Kilpatrick Townsend & Stockton LLP

(57) ABSTRACT

Exemplary semiconductor processing methods may include providing a silicon-containing precursor to a processing region of a semiconductor processing chamber. A substrate may be disposed within the processing region of the semiconductor processing chamber. The methods may include forming a plasma of the silicon-containing precursor in the processing region. The plasma may be at least partially formed by an RF power operating at between about 50 W and 1,000 W, at a pulsing frequency below about 100,000 Hz, and at a duty cycle between about 5% and 95%. The methods may include forming a layer of material on the substrate. The layer of material may include a silicon-containing material.

20 Claims, 3 Drawing Sheets

RF PULSING ASSISTED LOW-K FILM DEPOSITION WITH HIGH MECHANICAL STRENGTH

TECHNICAL FIELD

The present technology relates to deposition processes and chambers. More specifically, the present technology relates to methods of producing low-k films utilizing RF pulsing during deposition.

BACKGROUND

Integrated circuits are made possible by processes which produce intricately patterned material layers on substrate surfaces. Producing patterned material on a substrate requires controlled methods for forming and removing material. Material characteristics may affect how the device operates, and may also affect how the films are removed relative to one another. Plasma-enhanced deposition may produce films having certain characteristics. Many films that are formed require additional processing to adjust or enhance the material characteristics of the film in order to provide suitable properties.

Thus, there is a need for improved systems and methods that can be used to produce high quality devices and structures. These and other needs are addressed by the present technology.

SUMMARY

Exemplary semiconductor processing methods may include providing a silicon-containing precursor to a processing region of a semiconductor processing chamber. A substrate may be disposed within the processing region of the semiconductor processing chamber. The methods may include forming a plasma of the silicon-containing precursor in the processing region. The plasma may be at least partially formed by an RF power operating at between about 50 W and 1,000 W, at a pulsing frequency below about 100,000 Hz, and at a duty cycle between about 30% and 70%. The methods may include forming a layer of material on the substrate. The layer of material may include a silicon-containing material.

In some embodiments, the silicon-containing precursor may include at least one of dimethyldimethoxysilane, diethoxymethylsilane, octamethylcyclotetrasiloxane, 1,3-dimethyl-1,1,3,3-tetramethoxydisiloxane, isobutylmethyldimethoxysilane, tetramethyl-1,3-dimethoxydisiloxane, isobutyltrimethoxysilane, bis(methyldimethoxysilyl)methane, vinyltrimethoxysilane, vinylmethyldimethoxysilane, propylmethyldimethoxysilane, 1,2-Bis(methyldimethoxysilyl)ethane, or 1,3,5,7-Tetramethyl-1,3,5,7-tetramethoxycyclotetrasiloxane. A temperature within the semiconductor processing chamber may be maintained at less than or about 450° C. while forming the layer of material on the substrate. A pressure within the semiconductor processing chamber may be maintained at less than or about 50 Torr, or less than or about 20 Torr, while forming the layer of material on the substrate. The plasma may be at least partially formed by an RF power operating at a pulsing frequency below about 1,000 Hz. The plasma may be at least partially formed by an RF power operating at a duty cycle between about 30% and 50%. The layer of material may be characterized by a dielectric constant below or about 3.00. The layer of material may be characterized by a hardness of greater than or about 1.1 Gpa. The methods may also include curing the layer of material on the substrate by directing UV energy towards the substrate. The curing may include providing a helium-containing material, an argon-containing material, or both to the processing region of the semiconductor processing chamber at a temperature between about 75° C. and about 400° C. and a pressure between about 3 Torr and about 100 Torr.

Some embodiments of the present technology may encompass semiconductor processing methods. The methods may include providing a silicon-containing precursor to a processing region of a semiconductor processing chamber. A substrate may be disposed within the processing region of the semiconductor processing chamber. The methods may include forming a plasma of the silicon-containing precursor in the processing region. The plasma may be at least partially formed by an RF power operating at between about 500 W and about 1,000 W, at a pulsing frequency below about 10,000 Hz, and at a duty cycle between about 30% and 70%. The methods may include forming a layer of material on the substrate. The layer of material may include a silicon-containing material. The layer of material may be characterized by a dielectric constant below or about 3.00.

In some embodiments, the silicon-containing precursor may be characterized by Formula 1:

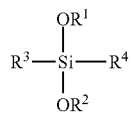

where $R^1$ may include —$CH_3$ or —$CH_2CH_3$, $R^2$ may include —$CH_3$ or —$CH_2CH_3$, $R^3$ may include —$CH_3$, —$OCH_3$ or H, and $R^4$ may include —$(CH_2)_nCH_3$, —$O(CH_2)_nCH_3$, —$CH=CH_2$, —$CH_2$—$CH_2$—$(CH_2CH_3)_2$, —$CH_2$—$CH(CH_3)_2$. A temperature within the semiconductor processing chamber may be maintained at less than or about 450 while forming the layer of material on the substrate. A pressure within the semiconductor processing chamber may be maintained at less than or about 20 Torr while forming the layer of material on the substrate. The plasma may be at least partially formed by an RF power operating at a pulsing frequency below about 1,000 Hz. The plasma may be at least partially formed by an RF power operating at a duty cycle between about 50% and 70%. The layer of material may be characterized by a hardness of greater than or about 1.2 Gpa.

In some embodiments, the plasma may be at least partially formed by an RF power operating at greater than or about 500 W and at a pulsing frequency below greater than or about 250 Hz and less than or about 1,000 Hz. The layer of material may be characterized by a hardness of greater than or about 1.4 Gpa.

Some embodiments of the present technology may encompass semiconductor processing methods. The methods may include providing a silicon-containing precursor to a processing region of a semiconductor processing chamber, wherein a substrate is disposed within the processing region of the semiconductor processing chamber, and wherein the silicon-containing precursor is characterized by Formula 1:

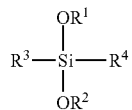

where $R^1$ may include —$CH_3$ or —$CH_2CH_3$, $R^2$ may include —$CH_3$ or —$CH_2CH_3$, $R^3$ may include —$CH_3$, —$OCH_3$ or H, and $R^4$ may include —$(CH_2)_nCH_3$, —$O(CH_2)_nCH_3$, —$CH=CH_2$, —$CH_2$—$CH_2$—$(CH_2CH_3)_2$, —$CH_2$—$CH(CH_3)_2$. The methods may include forming a plasma of the silicon-containing precursor in the processing region. The plasma may be at least partially formed by an RF power at a pulsing frequency below about 10,000 Hz and at a duty cycle between about 30% and 70%. The methods may include forming a layer of material on the substrate. The layer of material may include a silicon-containing material. The layer of material may be characterized by a dielectric constant below or about 2.90.

Such technology may provide numerous benefits over conventional systems and techniques. For example, pulsing RF power may improve deposition characteristics. For example, pulsing RF power during deposition operations may result in an increased ion density in the plasma, that may result in a dense material being deposited. The denser material may have increased mechanical strength while maintaining a low dielectric constant. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
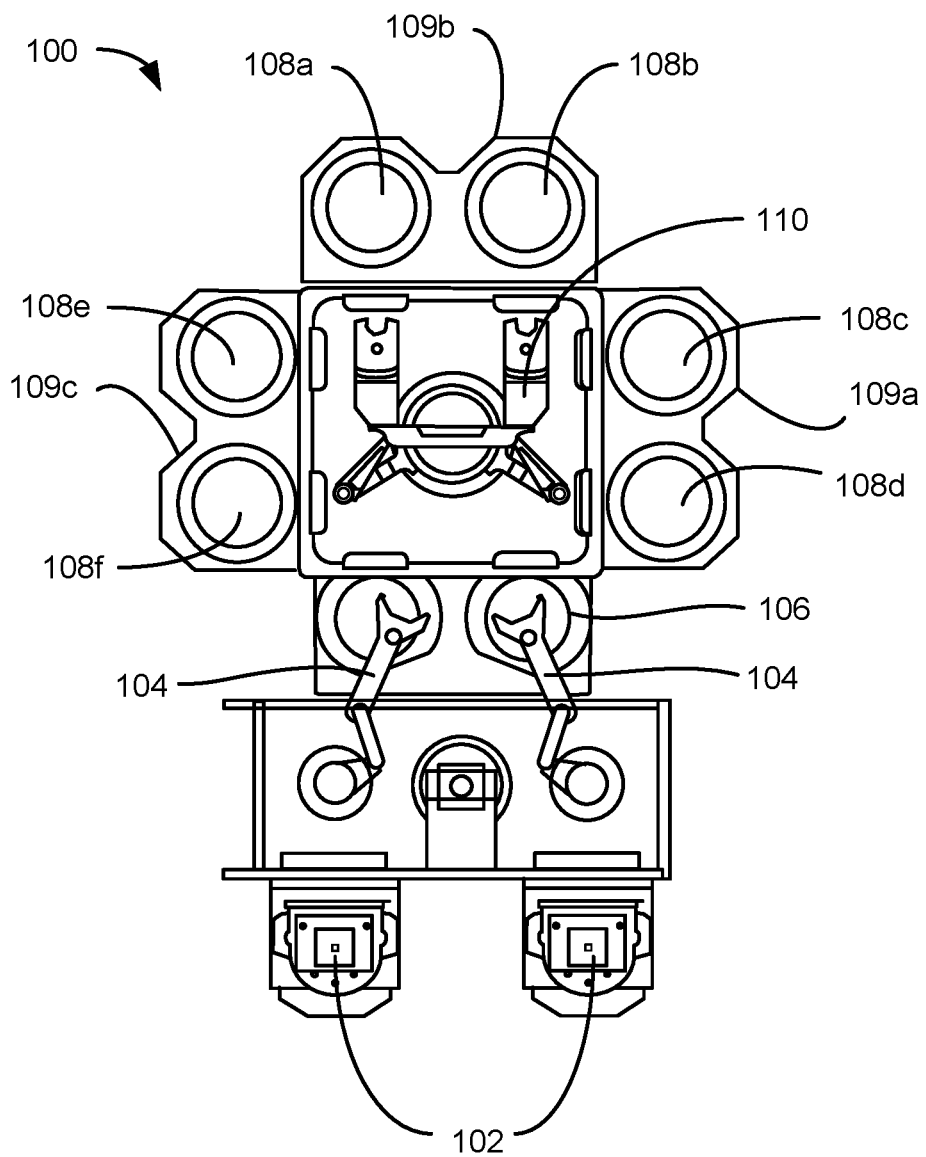
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. Any number of material films may be produced to develop semiconductor structures, including conductive and dielectric films, as well as films to facilitate transfer and removal of materials. Conventional low dielectric constant (low-k) films may be deposited by continuously applying RF power. This process may result in a film with a undesirable mechanical strength.

The present technology may overcome these issues by performing a deposition process while pulsing the RF power during the deposition of the low-k film. Much plasma processing in which low-k film is being deposited is performed at less than 500 W, which produces an ion density that may affect material properties by depositing denser films without substantially modifying the amount of carbon-containing material deposited. In the present embodiments, the RF power is pulsed during deposition at higher plasma power than conventional methods to increase the ion density of the plasma. By increasing the ion density of the plasma, the material deposited may be a denser material than the material deposited during continuous RF power. This may advantageously increase the mechanical strength of the material, while simultaneously substantially maintaining the low dielectric constant properties of the film. The produced films may be characterized by higher hardness and Young's modulus characteristics over conventional technologies, and may also retain useful dielectric constant values.

Although the remaining disclosure will routinely identify specific deposition processes utilizing the disclosed technology, it will be readily understood that the systems and methods are equally applicable to other deposition chambers, as well as processes as may occur in the described chambers. Accordingly, the technology should not be considered to be so limited as for use with these specific deposition processes or chambers alone. The disclosure will discuss one possible system and chamber that may be used to perform deposition processes according to embodiments of the present technology before additional details according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
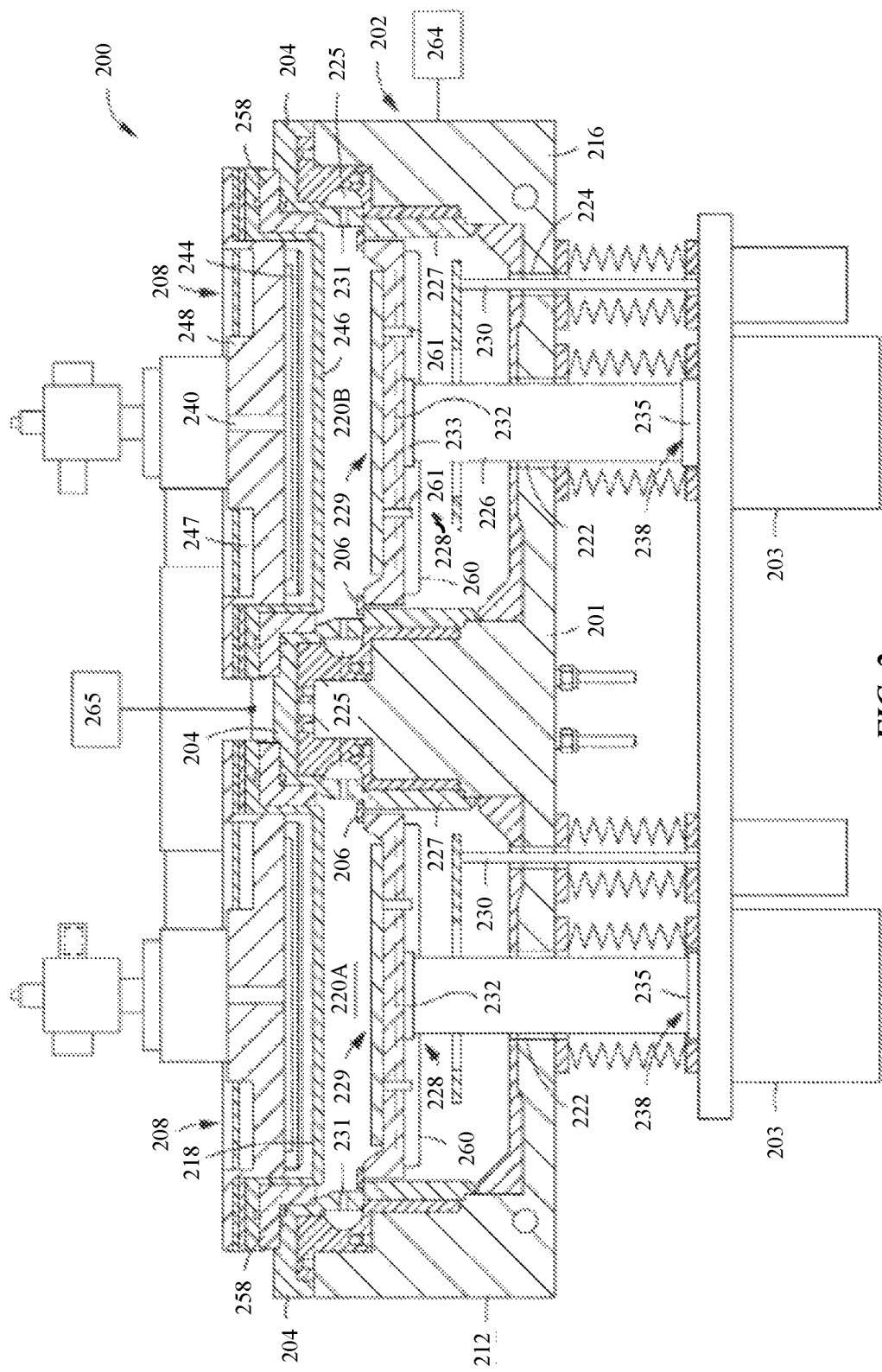
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include lid stack components according to embodiments of the present technology, and as may be explained further below. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a dual-channel showerhead 218 into the processing region 220B. The dual-channel showerhead 218 may include an annular base plate 248 having a blocker plate 244 disposed intermediate to a faceplate 246. A radio frequency ("RF") source 265 may be coupled with the dual-channel showerhead 218, which may power the dual-channel showerhead 218 to facilitate generating a plasma region between the faceplate 246 of the dual-channel showerhead 218 and the pedestal 228. In some embodiments, the RF source may be coupled with other portions of the chamber body 202, such as the pedestal 228, to facilitate plasma generation. A dielectric isolator 258 may be disposed between the lid 204 and the dual-channel showerhead 218 to prevent conducting RF power to the lid 204. A shadow ring 206 may be disposed on the periphery of the pedestal 228 that engages the pedestal 228.

An optional cooling channel 247 may be formed in the annular base plate 248 of the precursor distribution system 208 to cool the annular base plate 248 during operation. A heat transfer fluid, such as water, ethylene glycol, a gas, or the like, may be circulated through the cooling channel 247 such that the base plate 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
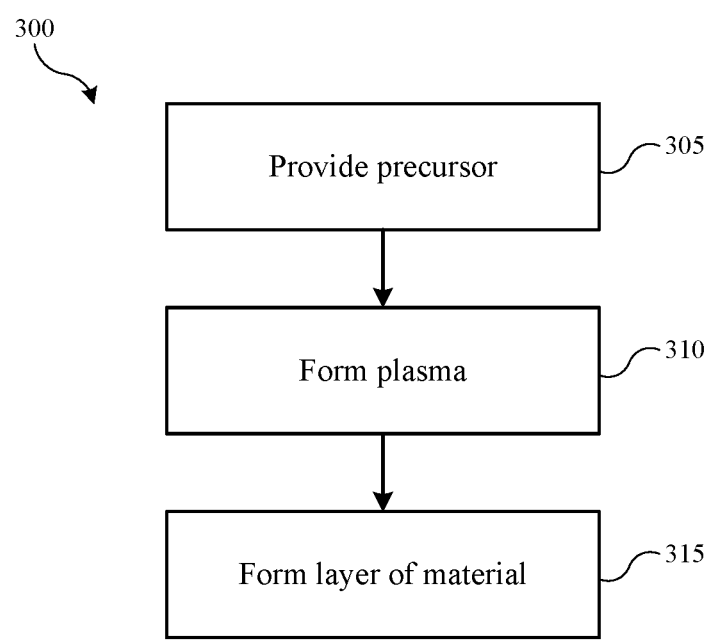
FIG. 3 shows operations of an exemplary method of semiconductor processing according to some embodiments of the present technology.

FIG. 3 shows operations of an exemplary method 300 of semiconductor processing according to some embodiments of the present technology. The method may be performed in a variety of processing chambers, including processing system 200 described above, as well as any other chamber in which plasma deposition may be performed. Method 300 may include a number of optional operations, which may or may not be specifically associated with some embodiments of methods according to the present technology.

Method 300 may include a processing method that may include operations for forming a layer of material, such as a film, or other deposition operations while pulsing RF power, which may result in low dielectric constant film with increased mechanical strength characteristics. The method may include optional operations prior to initiation of method 300, or the method may include additional operations. For example, method 300 may include operations performed prior to the start of the method, including additional deposition, removal, or treatment operations. In some embodiments, method 300 may include flowing one or more silicon-containing precursors into a processing chamber at operation 305, which may deliver the precursor or precursors into a processing region of the chamber where a substrate may be housed, such as region 220, for example.

In some embodiments, the precursor may be or include a silicon-containing precursor for producing a low-k dielectric layer, such as silicon oxide. The precursors may or may not include delivery of additional precursors, such as carrier gases or one or more oxygen-containing precursors for depositing an oxide layer. In some embodiments, the deposition may utilize a single deposition precursor that includes silicon and oxygen. Although a carrier gas, such as an inert precursor, may be delivered with the deposition precursor, additional precursors intended to react with the deposition precursor and produce deposition products may not be used. By limiting the deposition to a single precursor, more simplified deposition chambers may be used, as uniform mixing and delivery of multiple precursors may not be required.

Silicon-containing precursors according to some embodiments of the present technology may include precursors having silicon, and may include linear branched precursors, cyclic precursors, or any number of additional precursors. Although any number of precursors may be utilized, in some embodiments of the present technology, exemplary silicon-containing precursors may be characterized by the following general Formula 1:

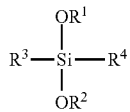

where $R^1$ may include —$CH_3$ or —$CH_2CH_3$,
$R^2$ may include —$CH_3$ or —$CH_2CH_3$,
$R^3$ may include —$CH_3$, —$OCH_3$ or H, and
$R^4$ may include —$(CH_2)_nCH_3$, —$O(CH_2)_nCH_3$, —$CH=CH_2$, —$CH_2$—$CH_2$—$(CH_2CH_3)_2$, —$CH_2$—$CH(CH_3)_2$.

Any number of precursors may be encompassed by this general formula or other formulae that may provide one or more characteristics for film formation, and may produce low-k silicon materials, such as silicon oxide, for example. Exemplary precursors that may act as single deposition precursors, or may be combined in some embodiments according to the present technology may include precursors according to any of the following structures or formulae:

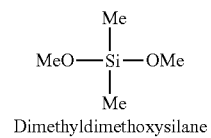
Dimethyldimethoxysilane

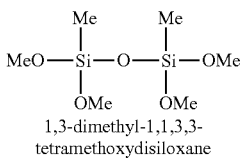
1,3-dimethyl-1,1,3,3-tetramethoxydisiloxane

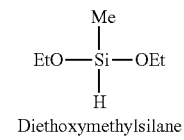
Diethoxymethylsilane

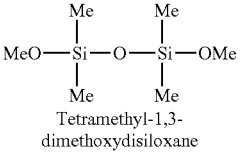
Tetramethyl-1,3-dimethoxydisiloxane

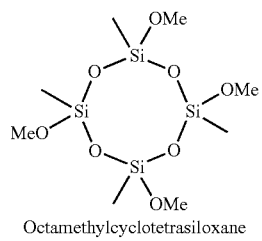
Octamethylcyclotetrasiloxane

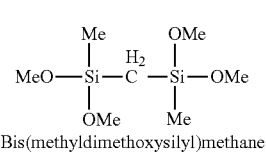
Bis(methyldimethoxysilyl)methane

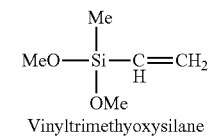
Vinyltrimethyoxysilane

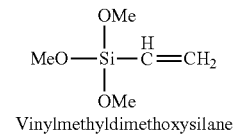
Vinylmethyldimethoxysilane

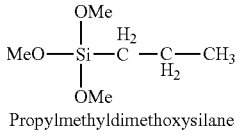
Propylmethyldimethoxysilane

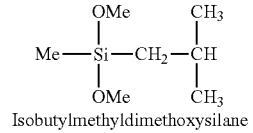
Isobutylmethyldimethoxysilane

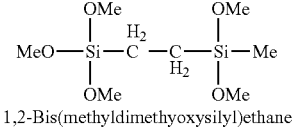
1,2-Bis(methyldimethyoxysilyl)ethane

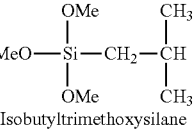
Isobutyltrimethoxysilane

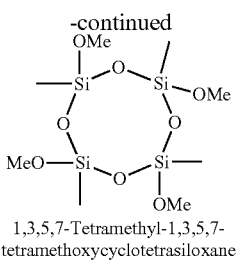
1,3,5,7-Tetramethyl-1,3,5,7-tetramethoxycyclotetrasiloxane

At operation 310, a plasma may be generated of the precursors within the processing region, such as by providing RF power to the faceplate to generate a plasma within processing region 220, although any other processing chamber capable of producing plasma may similarly be used. The plasma may be formed by pulsing RF power, instead of using continuous RF power. The RF power may cycle between cycles of being "on" and "off" repeatedly. During "on" cycles, the RF operating power may be greater than or about 50 W or less than or about 1,000 W. A pulsing frequency may be below about 100,000 Hz. A duty cycle may be between about 5% and 95%. Pulsing the RF power may increase the ion density while maintaining the average ion energy, as compared to continuous RF power. In conventional continuous processes, the ion density may be about $1\times10^{16}$ ions per cubic meter, whereas embodiments of the present disclosure may feature an ion density greater than this amount, such as greater than or about $1\times10^{18}$ or $1\times10^{19}$ ions per cubic meter. This may increase the density of the film while maintaining the amount of carbon-containing material deposited in the film, which may contribute to increased mechanical strength of the film without increasing the dielectric constant of the film.

In conventional deposition processes, the continuous RF power may be at less than 500 W. In embodiments of the present disclosure, the RF power may be at a higher level during "on" cycles. In conventional deposition processes of low-k films, higher plasma RF power may adversely affect methyl incorporation into the layer of material. However, the present disclosure has discovered that by cycling with increased plasma power, ion density may be increased compared to continuous RF power while maintaining a similar ion energy as continuous RF power. In embodiments, the RF power may be greater than or about 500 W, greater than or about 600 W, greater than or about 700 W, greater than or about 800 W, greater than or about 850 W, greater than or about 900 W, greater than or about 950 W, greater than or about 1,000 W, or higher.

By increasing the pulsing frequency, the mechanical strength of the material may be increased. Higher pulsing frequencies may increase the dielectric constant at a greater rate than lower pulsing frequencies. Further, lower pulsing frequencies may increase the mechanical strength at a greater rate than higher pulsing frequencies. In embodiments of the present disclosure, the pulsing frequency may be less than or about 12,500 Hz, less than or about 10,000 Hz, less than or about 7,500 Hz, less than or about 5,000 Hz, less than or about 2,500 Hz, less than or about 1,250 Hz, less than or about 750 Hz, less than or about 500 Hz, or lower. Frequencies between around 500 Hz and around 1,000 Hz have been observed to increase the mechanical strength and dielectric constant of the material at the greatest rate, but frequencies less than 500 Hz or greater than 1,000 Hz still provide increased properties compared to continuous RF power.

With higher duty cycles, the mechanical strength may increase, but the dielectric constant may also increase. If the duty cycle is greater than 95%, the dielectric constant may increase. Lower duty cycles may increase SiCSi bonding, which may result in the dielectric constant increasing. By maintaining a duty cycle between about 30% and about 70%, a material may be produced, which is characterized by both a lower dielectric constant as well as an improved mechanical strength. For example, the duty cycle may be greater than or about 35%, greater than or about 40%, greater than or about 45%, greater than or about 50%, greater than or about 55%, greater than or about 60%, or greater than or about 65%. Similarly, the duty cycle may be less than or about 65%, less than or about 60%, less than or about 55%, less than or about 50%, less than or about 45%, less than or about 40%, or less than or about 35%.

The deposition may be performed at substrate or pedestal temperatures less than or about 450° C., which may be due to thermal budget issues at back end of line operations. Consequently, in some embodiments the deposition may occur at temperatures less than or about 425° C., less than or about 400° C., less than or about 375° C., less than or about 350° C., less than or about 325° C., less than or about 300° C., less than or about 275° C., less than or about 250° C., less than or about 225° C., less than or about 200° C., or lower. Additionally, the deposition may be performed at a pressure of less than or about 50 Torr, such as less than or about 40 Torr, less than or about 30 Torr, less than or about 20 Torr, less than or about 15 Torr, less than or about 10 Torr, less than or about 7 Torr, less than or about 5 Torr, less than or about 2 Torr, or lower. The greatest benefits to both dielectric constant and mechanical strength have been observed that at pressures of less than or about 20 Torr.

Material formed in the plasma may be deposited on the substrate at operation 315, which may produce a layer of material on the substrate. The layer of material may include silicon-containing material, such as a silicon oxide. By pulsing the RF power, ion density in the plasma may be increased, which may increase mechanical strength in the layer of the material to be deposited on the substrate. An increased ion density during RF pulsing may densify the film and, therefore, strengthen the film, as compared to conventional methods using continuous RF power. Further, by maintaining the average ion energy, this may allow the carbon-containing material in the layer of material deposited on the substrate to be maintained.

After deposition to a sufficient thickness, the substrate may undergo a curing treatment. For example, the substrate may be transferred to a second chamber to perform a treatment, such as the curing treatment or other post-deposition treatment. The curing treatment may include directing UV energy towards the substrate to cure the layer of material on the substrate. Process conditions during the curing treatment may include a temperature between about 75 and about 400 and a pressure between about 3 Torr and about 100 Torr. During the curing treatment, a helium-containing gas, an argon-containing gas, or both may be supplied to the chamber. The helium-containing gas and the argon-containing gas may be provided to the chamber at a rate of about 1,000 sccm to about 20,000 sccm each. The curing treatment may proceed for about 1 minute to about 10 minutes.

As explained above, conventional technologies operating at continuous plasma power may cause the ion density to be lower than if the plasma power were pulsed, which may result in the mechanical strength of the material being lower than desired. By pulsing the RF power according to the present technology, low-k dielectric materials may be produced that may be characterized by a dielectric constant of less than or about 3.10, and may be less than or about 3.05, less than or about 3.00, less than or about 2.95, less than or about 2.90, less than or about 2.85, less than or about 2.80, less than or about 2.79, less than or about 2.78, less than or about 2.77, less than or about 2.76, less than or about 2.75, less than or about 2.74, less than or about 2.73, less than or about 2.72, less than or about 2.71, less than or about 2.70, less than or about 2.69, less than or about 2.68, less than or about 2.67, less than or about 2.66, less than or about 2.65, less than or about 2.64, less than or about 2.63, less than or about 2.62, less than or about 2.61, less than or about 2.60, or less.

Dielectric constant may be related to material properties of the film, where the lower the dielectric constant, the lower the Young's modulus and/or hardness of the film produced. By producing films according to some embodiments of the present technology, hardness and modulus may be maintained higher than would otherwise occur were conventional technologies capable of producing films with corresponding as-deposited dielectric constant values. For example, in some embodiments, the present technology may produce materials characterized by a Young's modulus of greater than or about 5.0 Gpa, and may be characterized by a Young's modulus of greater than or about 5.5 Gpa, greater than or about 6.0 Gpa, greater than or about 6.5 Gpa, greater than or about 7.0 Gpa, greater than or about 7.5 Gpa, greater than or about 8.0 Gpa, greater than or about 8.5 Gpa, greater than or about 9.0 Gpa, greater than or about 9.5 Gpa, greater than or about 10.0 Gpa, or higher. Similarly, the present technology may produce materials characterized by a hardness of greater than or about 0.9 Gpa, and may be characterized by a hardness of greater than or about 1.0 Gpa, greater than or about 1.1 Gpa, greater than or about 1.2 Gpa, greater than or about 1.3 Gpa, greater than or about 1.4 Gpa, greater than or about 1.5 Gpa, greater than or about 1.6 Gpa, greater than or about 1.7 Gpa, greater than or about 1.8 Gpa, greater than or about 1.9 Gpa, greater than or about 2.0 Gpa, or higher. Consequently, the present technology may produce films characterized by a lower dielectric constant, while maintaining higher Young's modulus and hardness characteristics of the materials.

The material characteristics produced by embodiments of the present technology may be related to an amount of methyl groups incorporated into the film, as well as an amount of non-methyl carbon incorporated within the film, such as $CH_2$ or CH, bonded within the film. The processing may release an amount of these materials, which may provide an amount of porosity to the film, while retaining an amount of methyl incorporation, which may facilitate lowering a dielectric constant of the film produced, whereas higher amounts of non-methyl carbon retained within the film may increase the dielectric constant above the values noted above. For example, in some embodiments, as-deposited materials produced according to the present technology may be characterized by a methyl or $CH_3$ percentage incorporated or retained within the film of greater than or about 2%, and may be characterized by a methyl incorporation within the film of greater than or about 2.5%, greater than or about 2.6%, greater than or about 2.7%, greater than or about 2.8%, greater than or about 2.9%, greater than or about 3.0%, greater than or about 3.1%, greater than or about 3.2%, greater than or about 3.3%, greater than or about 3.4%, greater than or about 3.5%, greater than or about 3.6%, greater than or about 3.7%, greater than or about 3.8%, greater than or about 3.9%, greater than or about 4.0%, or higher.

Additionally, a percentage of $CH_2$, and/or CH, and/or SiCSi may be less than or about 3.0% in the as-deposited materials, and may be less than or about 2.9%, less than or about 2.8%, less than or about 2.7%, less than or about 2.6%, less than or about 2.5%, less than or about 2.4%, less than or about 2.3%, less than or about 2.2%, less than or about 2.1%, less than or about 2.0%, less than or about 1.9%, less than or about 1.8%, or less. Accordingly, the as-deposited materials may be characterized by a ratio of methyl incorporation to non-methyl carbon incorporation of between about 1.0 and about 2.0, which may be greater than or about 1.1, greater than or about 1.2, greater than or about 1.3, greater than or about 1.4, greater than or about 1.5, greater than or about 1.6, greater than or about 1.7, greater than or about 1.8, greater than or about 1.9, or higher. By pulsing RF power along with other processing characteristics according to embodiments of the present technology, low-k dielectric materials may be produced, which may be characterized by increased hardness and Young's modulus values, among other material properties.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a silicon-containing precursor" includes a plurality of such silicon-containing precursors, and reference to "the layer of material" includes reference to one or more layers of material and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
providing a silicon-containing precursor to a processing region of a semiconductor processing chamber, wherein a substrate is disposed within the processing region of the semiconductor processing chamber;
forming a plasma of the silicon-containing precursor in the processing region, wherein the plasma is at least partially formed by an RF power operating at greater than or about 500 W, at a pulsing frequency below about 100,000 Hz, and at a duty cycle between about 30% and 70%, and wherein the plasma is characterized by an ion density of greater than or about $1 \times 10^{18}$ ions per cubic meter; and
forming a layer of material on the substrate, wherein the layer of material comprises a silicon-containing material.

2. The semiconductor processing method of claim 1, wherein the silicon-containing precursor comprises at least one of dimethyldimethoxysilane, diethoxymethylsilane, octamethylcyclotetrasiloxane, 1,3-dimethyl-1,1,3,3-tetramethoxydisiloxane, isobutylmethyldimethoxysilane, tetramethyl-1,3-dimethoxydisiloxane, isobutyltrimethoxysilane, bis(methyldimethoxysilyl)methane, vinyltrimethoxysilane, vinylmethyldimethoxysilane, propylmethyldimethoxysilane, 1,2-Bis(methyldimethoxysilyl)ethane, or 1,3,5,7-Tetramethyl-1,3,5,7-tetramethoxycyclotetrasiloxane.

3. The semiconductor processing method of claim 1, wherein a temperature within the semiconductor processing chamber is maintained at less than or about 450° C. while forming the layer of material on the substrate.

4. The semiconductor processing method of claim 1, wherein a pressure within the semiconductor processing chamber is maintained at less than or about 50 Torr while forming the layer of material on the substrate.

5. The semiconductor processing method of claim 1, wherein a pressure within the semiconductor processing chamber is maintained at less than or about 20 Torr while forming the layer of material on the substrate.

6. The semiconductor processing method of claim 1, wherein the plasma is at least partially formed by an RF power operating at a pulsing frequency below about 1,000 Hz.

7. The semiconductor processing method of claim 1, wherein the plasma is at least partially formed by an RF power operating at a duty cycle between about 30% and 50%.

8. The semiconductor processing method of claim 1, wherein the layer of material is characterized by an as-deposited dielectric constant below or about 3.00.

9. The semiconductor processing method of claim 1, wherein the layer of material is characterized by an as-deposited hardness of greater than or about 1.1 Gpa.

10. The semiconductor processing method of claim 1, further comprising:
curing the layer of material on the substrate by directing UV energy towards the substrate.

11. The semiconductor processing method of claim 10, wherein the curing comprises providing a helium-containing material, an argon-containing material, or both to the processing region of the semiconductor processing chamber at a temperature between about 75° C. and about 400° C. and a pressure between about 3 Torr and about 100 Torr.

12. A semiconductor processing method comprising:
providing a silicon-containing precursor to a processing region of a semiconductor processing chamber, wherein a substrate is disposed within the processing region of the semiconductor processing chamber;

forming a plasma of the silicon-containing precursor in the processing region, wherein the plasma is at least partially formed by an RF power operating at between about 500 W and about 1,000 W, at a pulsing frequency below about 10,000 Hz, and at a duty cycle between about 30% and 70%, and wherein the plasma is characterized by an ion density of greater than or about $1 \times 10^{18}$ ions per cubic meter; and forming a layer of material on the substrate, wherein the layer of material comprises a silicon-containing material, and wherein the layer of material is characterized by a dielectric constant below or about 3.00.

13. The semiconductor processing method of claim 12, wherein the silicon-containing precursor is characterized by Formula 1:

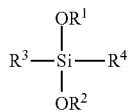

where $R^1$ may include —$CH_3$ or —$CH_2CH_3$,
$R^2$ may include —$CH_3$ or —$CH_2CH_3$,
$R^3$ may include —$CH_3$, —$OCH_3$ or H, and
$R^4$ may include —$(CH_2)_nCH_3$, —$O(CH_2)_nCH_3$, —$CH=CH_2$, —$CH_2$—$CH_2$—$(CH_2CH_3)_2$, —$CH_2$—$CH(CH_3)_2$.

14. The semiconductor processing method of claim 12, wherein:
a temperature within the semiconductor processing chamber is maintained at less than or about 450° ° C. while forming the layer of material on the substrate; and
a pressure within the semiconductor processing chamber is maintained at less than or about 20 Torr while forming the layer of material on the substrate.

15. The semiconductor processing method of claim 12, wherein the plasma is at least partially formed by an RF power operating at a pulsing frequency below about 1,000 Hz.

16. The semiconductor processing method of claim 12, wherein the plasma is at least partially formed by an RF power operating at a duty cycle between about 50% and 70%.

17. The semiconductor processing method of claim 12, wherein the layer of material is characterized by a hardness of greater than or about 1.2 Gpa.

18. A semiconductor processing method comprising:
providing a silicon-containing precursor to a processing region of a semiconductor processing chamber, wherein a substrate is disposed within the processing region of the semiconductor processing chamber, and wherein the silicon-containing precursor is characterized by Formula 1:

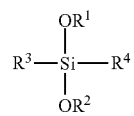

where $R^1$ may include —$CH_3$ or —$CH_2CH_3$,
$R^2$ may include —$CH_3$ or —$CH_2CH_3$,
$R^3$ may include —$CH_3$, —$OCH_3$ or H, and
$R^4$ may include —$(CH_2)_nCH_3$, —$O(CH_2)_nCH_3$, —$CH=CH_2$, —$CH_2$—$CH_2$—$(CH_2CH_3)_2$, —$CH_2$—$CH(CH_3)_2$;

forming a plasma of the silicon-containing precursor in the processing region, wherein the plasma is at least partially formed by an RF power at a pulsing frequency below about 10,000 Hz, and at a duty cycle between about 30% and 70%, and wherein the plasma is characterized by an ion density of greater than or about $1 \times 10^{18}$ ions per cubic meter; and forming a layer of material on the substrate, wherein the layer of material comprises a silicon-containing material, and wherein the layer of material is characterized by a dielectric constant below or about 2.90.

19. The semiconductor processing method of claim 18, wherein the plasma is at least partially formed by an RF power operating at greater than or about 500 W and at a pulsing frequency below greater than or about 250 Hz and less than or about 1,000 Hz.

20. The semiconductor processing method of claim 18, wherein the layer of material is characterized by a hardness of greater than or about 1.4 Gpa.

* * * * *